May 26, 1953 S. I. RAMBO 2,640,155

FREQUENCY CONTROL SYSTEM

Filed Dec. 17, 1948 2 Sheets-Sheet 1

WITNESSES:

Robert C. Baird

Wm. C. Groome

INVENTOR

Sheldon I. Rambo.

BY F. E. Browder

ATTORNEY

May 26, 1953 S. I. RAMBO 2,640,155

FREQUENCY CONTROL SYSTEM

Filed Dec. 17, 1948 2 Sheets-Sheet 2

WITNESSES:

Robert A. Baird

Wm. C. Groome

INVENTOR

Sheldon I. Rambo.

BY F. E. Browder

ATTORNEY

Patented May 26, 1953

2,640,155

UNITED STATES PATENT OFFICE 2,640,155

FREQUENCY CONTROL SYSTEM

Sheldon I. Rambo, Baltimore, Md., assignor to Westinghouse Electric Corporation, East Pittsburgh, Pa., a corporation of Pennsylvania Application December 17, 1948, Serial No. 65,959

10 Claims. (Cl. 250—36)

This invention relates to automatic frequency control systems, and more particularly to automatic frequency control systems for controlling the frequencies of an oscillator operating at any predetermined one of a plurality of frequencies or of a pair of discrete oscillators.

It is frequently desirable and necessary to maintain the frequency of the oscillations of an electronic oscillator substantially constant, whether the oscillator is used for communications or for industrial purposes. The frequency of the oscillator can be stabilized by employing a quartz crystal or a frequency controlling circuit element which possesses a constant resonant frequency. Such frequency stabilizing elements are, however, impractical for utilization in oscillators operating at high power. For controlling the frequencies of such oscillators automatic frequency control circuits, known as A. F. C. circuits, are frequently employed.

A large number of A. F. C. systems of various character are known to the prior art. Such systems generally consist of circuits responsive to the frequency deviations of the controlled oscillator from a standard value for generating control voltages, and circuits or devices for retuning the controlled oscillator in response to the control voltages. Systems of this character have proven satisfactory for controlling oscillators operating at a single predetermined frequency. However, if the controlled oscillator is to operate at more than a single predetermined frequency, the frequency converting circuits must be modified when the oscillator frequency is changed. This generally involves utilization of alternative groups of frequency control circuits, and of means for switching from one group of frequency control circuits to another.

Similarly, it is frequently necessary to control the frequencies of a pair of oscillators operating on different frequencies. It has been the usual practice in such case to control the frequency of each of the oscillators by means of entirely discrete means.

It is an object of the present invention to simplify the prior art by providing an automatic frequency control system of the type utilized in accordance with the prior art to control a single frequency oscillator, but in which the parameters involved are so selected as to enable effective frequency control, without any circuit changes whatever, when the controlled oscillator is tuned to either one of a pair of frequencies.

Another object of my invention is to provide an automatic frequency control system which requires no adjustment or modification when the frequency of the oscillator controlled thereby is changed from one predetermined frequency to another.

It is still another object of my invention to provide a system for controlling the frequencies of either of a pair of oscillators operating on different frequencies by means of a single automatic frequency control circuit.

It is still another object of my invention to provide an automatic frequency control system which is capable of providing automatic frequency control for an oscillator operating on either one of two different predetermined frequencies, without requiring a plurality of frequency standards or frequency deviation responsive circuits.

It is a further object of my invention to provide an automatic frequency control system which, without any modification or adjustment, is capable of controlling the frequencies of a multiple frequency oscillator, or of a pair of discrete oscillators, and which is, nevertheless, extremely simple in operation and design.

Briefly described the invention involves the frequency control of two alternative frequencies produced by two separate oscillators or by means of a single tunable oscillator, the frequencies being either harmonically related to one another, or both harmonically related to a single common frequency, or selected at random.

Either of the two frequencies may, in accordance with the invention, and when they are suitably related, be mixed or heterodyned with a third frequency, equal to the arithmetic mean of the first-mentioned two frequencies, the same difference frequency being thus derived from the third frequency in combination with either of the first two frequencies. The third frequency may be derived by frequency multiplication from the output of a crystal controlled oscillator having a frequency equal to the difference between the third and either of the first two frequencies, so that the output of the crystal controlled frequency may be directly compared with the difference frequency derived from the mixer in a zero beat automatic frequency control circuit, which in turn develops an A. F. C. voltage for the first-mentioned oscillator or oscillators for maintaining these very accurately tuned in desired relation to the frequency of the output of the crystal controlled oscillator.

If the two controlled frequencies are not simply related, or are selected at random, separate frequency controlled oscillators must be provided for generating one frequency equal to the arithmetic mean of the controlled frequencies and a further frequency equal to the product of conversion, or to the difference between the arithmetic mean and either of the controlled frequencies.

The foregoing, as well as further objects, features, and advantages of the present invention, will be made evident by reference to the following detailed description of various specific embodiments of the invention, especially when taken in conjunction with the accompanying drawings, wherein.

Figure 5:
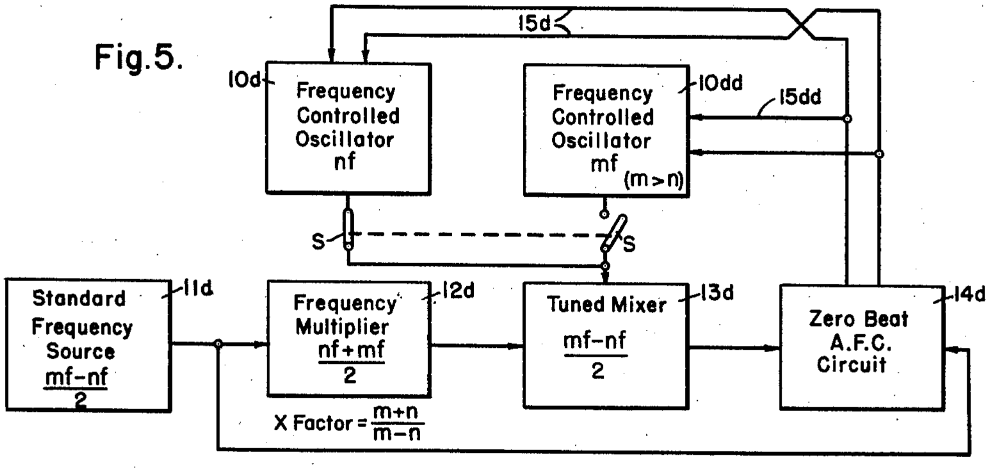
Figure 6:
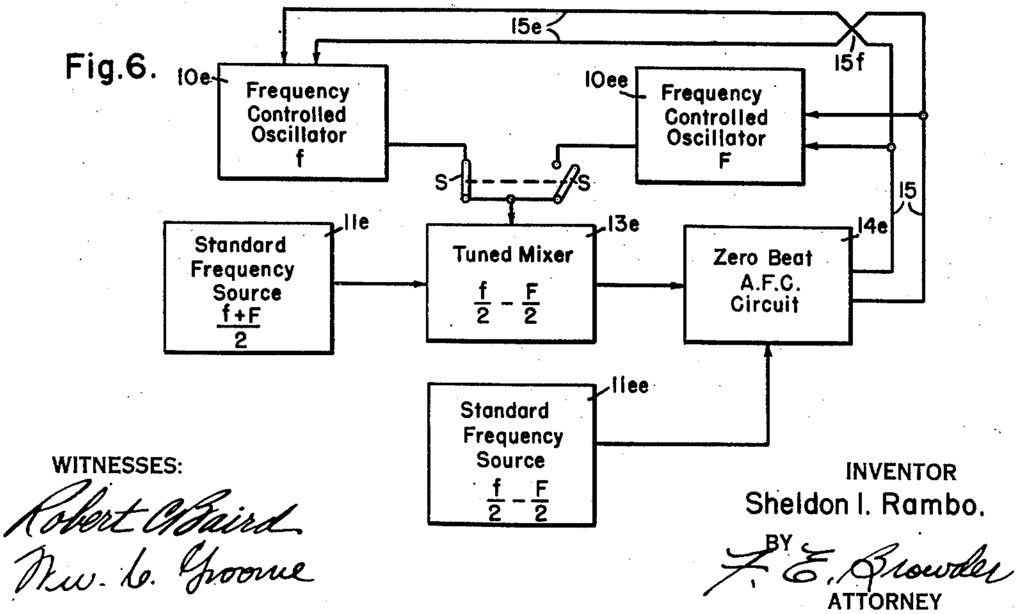

Figure 5 represents in simplified block diagram still another embodiment of my invention wherein the frequencies of two oscillators are controlled in response to the output of a standard frequency source, the two controlled frequencies being selected at random except in that these frequencies bear each a harmonic relation to a third frequency; and Figure 6 is a simplified block diagram of a further embodiment of my invention, wherein the frequencies of two controlled oscillators are selected entirely at random.

Figure 1:
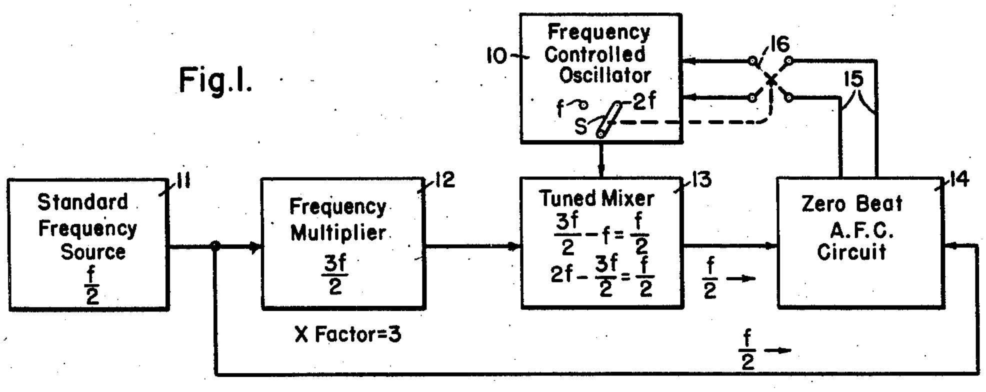
Figure 1 illustrates in simplified block diagram, an embodiment of my invention utilized for controlling two output frequencies of a single oscillator, these output frequencies being one the second harmonic of the other.

Referring now specifically to Figure 1 of the drawings, the controlled oscillator 10 may be of a type providing output frequencies equal to $f$ and $2f$, alternatively, in response to operation of a selective switch S. In such case, the standard frequency source 11 provides a frequency $$\frac{f}{2}$$

which may be multiplied by a factor of three in the frequency multiplier 12, the latter then providing an output frequency $$\frac{3f}{2}$$

The output of the frequency controlled oscillator 10 may beat with the output of the frequency multiplier 12 in a tuned mixer 13 having an output circuit tuned to the frequency $$\frac{f}{2}$$

i. e., the same frequency as is provided by the standard frequency source 11. It will be evident that an output frequency $$\frac{f}{2}$$

may be provided by the tuned mixer 13 either by conversion of the frequency $f$ provided by the frequency controlled oscillator 10 with the output frequency $$\frac{3f}{2}$$

provided by the frequency multiplier 12, or by subtraction of the output of the frequency multiplier 12 at a frequency $$\frac{3f}{2}$$

from the output of the frequency controlled oscillator 10 at a frequency $2f$. The output signal of frequency $$\frac{f}{2}$$

provided by the tuned mixer 13 may be combined with the output of the standard frequency source 11, likewise equal to $$\frac{f}{2}$$

in a zero beat A. F. C. circuit 14, which is of well-known character per se. The zero beat A. F. C. circuit 14 will, accordingly, generate a suitable D. C. voltage for controlling the frequency controlled oscillator 10, this voltage being applied to the frequency controlled oscillator 10 via the leads 15.

It will be evident that an increase of the frequency $f$ results in a decrease of the frequency of the output of the tuned mixer 13, whereas an increase of the frequency $2f$ will result in an increase of such output frequency. Since, however, the frequency control oscillator 10 requires control voltages of the same polarity to increase its frequency whether it is providing an output frequency $f$ or $2f$, it is necessary to apply to the frequency control oscillator 10 an automatic frequency control voltage of one polarity when the output frequency is $f$, and of opposite polarity when the output frequency is $2f$. To this end, a polarity reversing mechanism taking the form of a double pole, double throw switch 16 is provided, which is ganged with the frequency selection switch S, and which serves to apply A. F. C. voltage of one polarity to the frequency control oscillator 10 when the switch S is thrown to the left to select the frequency $f$, and voltage of opposite polarity when the switch S is thrown to the right to select a frequency $2f$.

Figure 2:
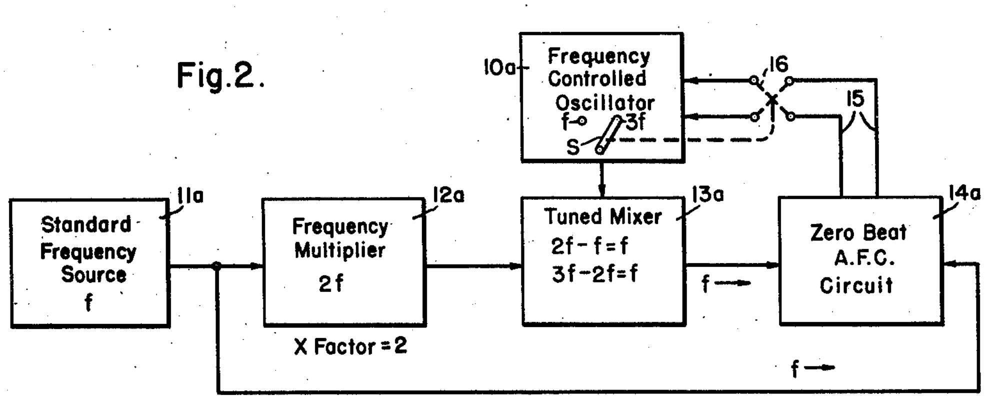
Figure 2 illustrates in simplified block diagram a further embodiment of my invention similar to the embodiment illustrated in Figure 1, but wherein one of the control frequencies is a third harmonic of the other.

Referring now to the system illustrated in Figure 2 of the drawings, it will be evident that the system of Figure 2 and the system of Figure 1 are identical, except in that in the system of Figure 2 the controlled frequencies are equal to $f$ and $3f$ rather than to $f$ and $2f$. Identical elements in Figures 1 and 2 have, accordingly, been identified by identical numerals of reference, and where elements are identical except in respect to the frequency or frequencies generated or applied thereto the elements have been identified by reference numerals identical with the reference numerals utilized in Figure 1 except for the addition of a subscript.

In the system of Figure 2, the two frequencies provided being $f$ and $3f$, the output of the heterodyning frequency applied to the tuned mixer 13a for conversion with the frequencies $f$ and $3f$, required to equal the arithmetic mean of the frequencies $f$ and $3f$, is established at $2f$. The frequency to which the output circuit of the tuned mixer 13a is tuned is, accordingly, $f$, or a value equal to the difference between either $2f$ and $f$ or $3f$ and $2f$. The standard frequency source 11a must, accordingly, have a value $f$ in order that it may be compared in the zero beat A. F. C. circuit 14a with the output of the tuned mixer 13a, and it will be obvious that the input to the tuned mixer 13a at frequency $2f$ may be derived from the standard frequency source at frequency $f$ by simple multiplication by a factor of 2.

Figure 3:
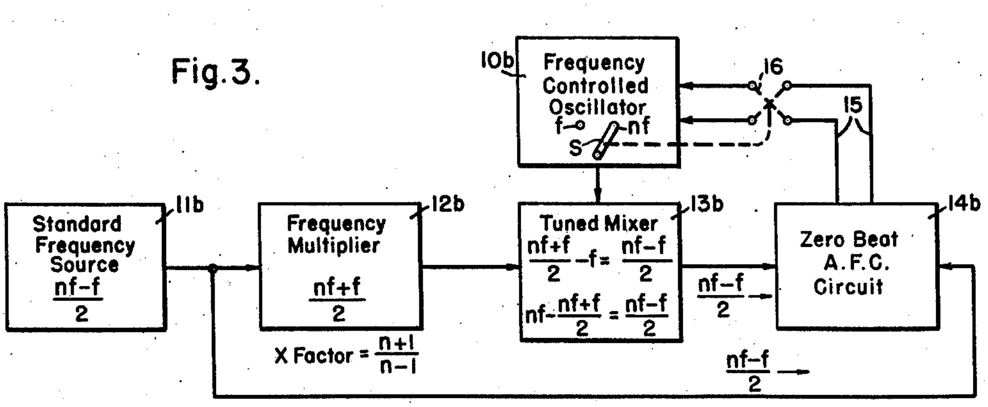
Figure 3 is a further simplified block diagram of a further embodiment of my invention, having the general character of the embodiment illustrated in Figures 1 and 2 of the drawings, but wherein one of the controlled frequencies is the $n$th harmonic of the other controlled frequency.

Referring now specifically to the Figure 3 of the drawings, the frequency control oscillator, now identified by the reference numeral 10b, may be controlled to provide output frequencies of $f$ or $nf$, alternatively. Accordingly, the system of Figure 3 presents a generalization of the systems of Figures 1 and 2, the factor $n$ being equal to 2 in the system of Figure 1, and to 3 in the system of Figure 2.

In order that the tuned mixer 13b shall provide an identical frequency when the input frequency thereto consists of either the frequency $f$ or the frequency $nf$, it is essential that a heterodyning frequency equal to the arithmetic mean of the frequencies $f$ and $nf$ be supplied. Such a frequency may be supplied by the frequency multiplier 12b, the mean arithmetic frequency equaling $$\frac{nf+f}{2}$$

Conversion of the frequency $f$ with $$\frac{nf+f}{2}$$

or of $nf$ with $$\frac{nf+f}{2}$$

by the tuned mixer 13b provides an output frequency $$\frac{nf-f}{2}$$

which is applied to the input circuit of the zero beat A. F. C. circuit 14b. The frequency $$\frac{nf+f}{2}$$

provided by the frequency multiplier 12b may be derived from a standard frequency source 11b which provides a frequency $$\frac{nf-f}{2}$$

identical with the output freqency of the tuned mixer 13b, and accordingly suitable for comparison therewith in the zero beat A. F. C. circuit 14b, by designing the frequency multiplier 12b to have a multiplication factor $$\frac{n+1}{n-1}$$

Systems disclosed in Figures 1 to 3, inclusive, of the drawings, relate to control of an oscillator to produce accurately one or another of a pair of frequencies, these frequencies being harmonically related.

Figure 4:
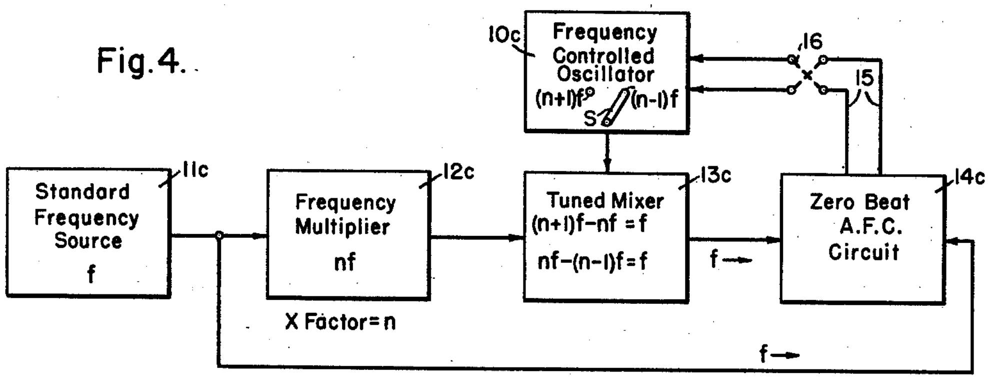
Figure 4 is a simplified block diagram of still a further embodiment of my invention wherein the two controlled frequencies are not harmonically related to one another but bear a specified harmonic relation to a standard or controlling frequency.

In the system of Figure 4, the two frequencies generated by the frequency controlled oscillator 10c, are no longer harmonically related to one another, but they are harmonically related to a common frequency $f$, and are separated by the interval $2f$.

Accordingly, the frequency outputs of the frequency controlled oscillator 10c may be generally described as corresponding with the frequencies $(n\pm1)f$. In order to provide a beat or heterodyning frequency which, when combined with either of the frequencies $(n\pm1)f$ will generate the same frequency, the heterodyning frequency must have a frequency value equal to the mean of the values $(n\pm1)f$, or a frequency $nf$. The output of the tuned mixer 13c must then be tuned to the algebraic difference of the frequencies $(n\pm1)f$ provided by the frequency controlled oscillator 10c, and the frequency $nf$ provided by the frequency multiplier 12c, i. e., to a frequency $f$. The frequency $f$ then is applied to one of the input circuits of the zero beat A. F. C. circuit 14c for comparison therein with a further frequency $f$ provided by a standard frequency source 11c. The heterodyning signal of frequency $nf$ for application to the tuned mixer 13c may be derived from the standard frequency source 11c by multiplication by factor $n$ in frequency multiplier 12c.

It will be noted that, in the system of Figure 4, two restrictions exist with respect to the frequencies which may be provided by the frequency controlled oscillator 10c. These restrictions are (1) both frequencies must be harmonics of a third frequency, and (2) the frequencies must differ by twice this common frequency. In the system of Figure 5, on the other hand, the second limitation has been eliminated. The frequencies provided by two separate frequency controlled oscillators 10d and 10dd are selected to be harmonics of a common frequency $f$, but either one of the frequencies may be constituted of any desired harmonic of the frequency $f$. Accordingly, and for purposes of generalization, the frequency controlled oscillator 10d is represented as providing an output frequency $nf$ while the frequency controlled oscillator 10dd is represented as providing an output frequency $mf$. While, in fact, $n$ and $m$ may be chosen arbitrarily, it will be realized that one of the quantities $m$ must be greater than the other quantity $n$, and selection has been accordingly made arbitrarily, for purposes of simplification of the exposition of the system, that $m$ shall be greater than $n$.

The output of the frequency controlled oscillators 10d and 10dd may be selectively applied to an input circuit of the tuned mixer 13d, via selective switches S, one of which is normally open when the other is closed, the switches being mechanically ganged to this end. The heterodyning frequency applied to the tuned mixer 13d must, as in the other embodiments of the invention previously described, provide an output frequency equal to the mean of the frequencies $nf$ and $mf$ provided by the frequency controlled oscillators 10d and 10dd, this mean frequency being then $$\frac{f(m+n)}{2}$$

The output circuit of the tuned mixer 13d must be tuned then to the difference between the frequency $$\frac{f(m+n)}{2}$$

and either $nf$ or $mf$. Assuming, then, that $m$ is greater than $n$ the output circuit of the tuned mixer 13d must be tuned to the frequency $$\frac{f(m-n)}{2}$$

that frequency being then applied to one input terminal of the zero beat A. F. C. circuit 14d, to the other terminal of which is applied an identical frequency derived from a standard frequency source having an output frequency $$\frac{f(m-n)}{2}$$

The heterodyning signal provided by the frequency multiplier 12d may be derived from the standard frequency source 11d by multiplying the latter by the factor $$\frac{m+n}{m-n}$$

In each of the systems previously described some limitation has been placed upon the relation between the frequencies generated by the frequency controlled oscillators or selectively generated by a single frequency oscillator. In the system of Figure 6 on the other hand, no limitations of any character have been placed on the frequencies involved, and the frequency controlled oscillator 10e may, accordingly, be assumed to generate a frequency $f$ while the frequency controlled oscillator 10ee may be assumed to generate a frequency F. The output of the oscillator 10ee may be applied to an input circuit of the tuned mixer 13e via selective switches S, one of which is normally closed while the other is open, and which are mechanically ganged for that purpose.

It is essential, as in the previously described embodiments of my invention, that there be applied as a heterodyning signal to the tuned mixer 13e, a signal at a frequency equal to the arithmetic means of the frequency $f$ and F, this frequency being equal then to $$\frac{f+F}{2}$$

Such a frequency may be supplied by a standard frequency source 11e which may be constituted of a crystal controlled oscillator. The output circuit of the tuned mixer 13e must, accordingly, be tuned to the frequency difference between $$\frac{f+F}{2}$$

and either $f$ or F, or must be tuned to the frequency $$\frac{f}{2}-\frac{F}{2}$$

the latter frequency then being applied to one input circuit of the zero beat A. F. C. circuit 14e.

A comparison signal for comparison with the output of the tuned mixer 13e must now be provided by means of a further standard frequency source 11ee, which provides a frequency $$\frac{f}{2}-\frac{F}{2}$$

to the input of the zero beat A. F. C. circuit 14e for comparison with the output signals derivable from the tuned mixer 13e.

Since the product frequency provided by the tuned mixer 13e will vary in different directions as the output of the frequency controlled oscillator 10e and 10ee vary in the same direction, it is necessary that the automatic frequency control signal provided by the zero beat A. F. C. circuit 14e be of different polarity when applied to the separate oscillators 10e and 10ee. The A. F. C. voltage derived from the zero beat A. F. C. circuit 14e may, accordingly, be applied to the frequency controlled oscillator 10ee via the leads 15, and to the frequency controlled oscillator 10e via the leads 15e which are connected with the leads 15, but which contain at 15f a polarity reversing loop.

The zero beat frequency A. F. C. circuits employed in the various embodiments of my invention are well known in the art, and require no exposition, per se. Examples of suitable zero beat A. F. C. circuits are described and illustrated in Letters Patent of the United States #2,288,025, issued to A. P. Pomeroy on June 30, 1942, and particularly #2,274,434 issued to C. F. Sheaffer on February 24, 1942.

While I have described and illustrated various specific embodiments of my invention it will be clear that variations of the arrangements illustrated may be resorted to without departing from the true spirit and scope of the invention.

I claim as my invention:

1. A high frequency generator comprising, means subject to frequency deviation for generating oscillations having nominally either of a pair of predetermined frequencies, means for producing further oscillations of accurately determined frequency combinable with either of said predetermined frequencies to produce oscillations nominally of a single third frequency, a mixer circuit for combining said further oscillations with a selected one of said oscillations of predetermined frequencies to produce said oscillations nominally of said single third frequency, frequency stabilized means for generating further signals of said third frequency, and means responsive to deviations of the frequency of said oscillations of said single third frequency from the frequency of said further signals for reducing said deviation by controlling the frequency of said controlled oscillator.

2. A high frequency generator comprising a controlled oscillator adapted to generate one of at least two predetermined frequencies, a frequency stabilized oscillator for producing first oscillations of a substantially constant frequency, means for converting said first oscillations into further oscillations having a further frequency substantially equal to the arithmetic mean of said predetermined frequencies, a mixer circuit for heterodyning either of said predetermined frequencies with said further oscillations for producing control oscillations of substantially a prechosen frequency, and frequency control circuit means responsive to frequency deviations of said control oscillations relative to the frequency of said first oscillations for adjusting the frequency of said controlled oscillator such that said deviations are thereby reduced.

3. A high frequency generator comprising a frequency controlled oscillator adapted to operate on one of at least two predetermined frequencies, a standard oscillator for producing oscillations of constant frequency, means for converting said oscillations into further oscillations having a second frequency equal to the arithmetic mean of said two predetermined frequencies, means for heterodyning either one of said predetermined frequencies with said further oscillations to produce oscillations nominally of said constant frequency and subject to a frequency deviation $\pm\Delta f$, a zero beat comparison circuit for comparing said last-named oscillations with said constant frequency oscillations to generate a frequency control voltage substantially proportional to $\pm\Delta f$, and means responsive to said frequency control voltage for adjusting the frequency of said controlled oscillator to reduce said deviations $\pm\Delta f$.

4. A high frequency generator comprising a controlled oscillator for producing oscillations having either of two frequencies $(n-1)f\pm\Delta f$ and $(n+1)f\pm\Delta f$, where $(n-1)f$ and $(n+1)f$ are predetermined frequencies, with $n$ being any integer, and $\pm\Delta f$ represents a variable frequency deviation, frequency stabilized means for producing oscillations of frequencies $f$ and $nf$, a mixer circuit for selectively combining said oscillations of frequency $nf$ with said oscillations of frequency $(n-1)f\pm\Delta f$ or $(n+1)f\pm\Delta f$ to produce resulting oscillations of frequency $f\pm\Delta f$, and automatic frequency control circuits responsive jointly to said oscillations of frequency $f\pm\Delta f$ and said oscillations of frequency $f$ for adjusting said controlled oscillator to reduce said deviations $\pm\Delta f$.

5. In combination, a source of frequency controllable oscillations of either of frequencies $f$ and F, means for generating frequency stabilized oscillations of frequency $$\frac{f+F}{2}$$

means for combining either one of said frequencies $f$ and F with said frequency stabilized oscillations of frequency $$\frac{f+F}{2}$$

to produce comparison oscillations of frequency $$\frac{f-F}{2}$$

means for generating frequency stabilized oscillations of frequencies $$\frac{f-F}{2}$$

and a zero beat automatic frequency control circuit for comparing the frequency of said last-named frequency stabilized oscillations with the frequency of said comparison oscillations and to generate an automatic frequency control voltage for said source of frequency controllable oscillations in response to frequency differences between said last-named frequencies.

6. In combination, frequency controllable oscillators arranged to generate either of frequencies $nf$ or $mf$, where $m>n$, and $m$ and $n$ are integers, a frequency stabilized source of oscillations of frequency $$\frac{mf-nf}{2}$$

means for multiplying the frequency of said oscillations by a factor $$\frac{m+n}{m-n}$$

to generate further oscillations having a frequency $$\frac{nf+mf}{2}$$

means for combining either one of said frequencies $mf$ or $nf$ with said frequency $$\frac{nf+mf}{2}$$

to produce comparison oscillations at a frequency $$\frac{mf-nf}{2}$$

a zero beat automatic frequency control circuit for comparing the frequency of said oscillations with the frequency of said comparison oscillations and to generate an automatic frequency control voltage for said frequency controllable oscillators in response to frequency differences therebetween.

7. In combination, frequency controllable oscillators arranged to generate either of frequencies $f$ or F, said frequencies $f$ and F bearing no necessary relation one to another, means for generating frequency stabilized oscillations of frequency $$\frac{f+F}{2}$$

means for combining either one of said frequencies $f$ or F with said frequency $$\frac{f+F}{2}$$

to produce comparison oscillations at a frequency $$\frac{f-F}{2}$$

means for generating further frequency stabilized oscillations of frequency $$\frac{f-F}{2}$$

a zero beat automatic frequency control circuit for comparing the frequency of said further frequency stabilized oscillations with the frequency of said comparison oscillations and to generate an automatic frequency control voltage for said frequency controllable oscillators in response to frequency differences therebetween.

8. In combination, a frequency controllable oscillator arranged to generate either of frequencies $f$ or $nf$, where $n$ is any integer, a frequency stabilized source of oscillations of frequency $$\frac{nf-f}{2}$$

means for multiplying the frequency of said oscillations by a factor $$\frac{n+1}{n-1}$$

to generate further oscillations having a frequency $$\frac{nf+f}{2}$$

means for combining either one of said frequencies $f$ or $nf$ with said frequency $$\frac{nf+f}{2}$$

to produce comparison oscillations at a frequency $$\frac{nf-f}{2}$$

a zero beat automatic frequency control circuit for comparing the frequency of said oscillations with the frequency of said comparison oscillations and to generate an automatic frequency control voltage for said frequency controllable oscillator in response to frequency differences therebetween.

9. A high-frequency generator comprising, a source of high frequency oscillations adapted to generate either first oscillations or second oscillations from a plurality of predetermined frequencies, a frequency stabilized oscillator for producing further oscillations of a substantially constant frequency, said constant frequency being the arithmetic mean of said first and second oscillations, mixer means for combining said first oscillations and said further oscillations to produce resulting oscillations of a third frequency, a source of stabilized prechosen frequency oscillations, said last-named oscillations having substantially the same frequency as said resulting oscillations, and frequency control means responsive to deviations of said resulting oscillations relative to said prechosen frequency oscillations.

10. In combination with a high-frequency generator, means for generating first oscillations having either one of a pair of predetermined frequencies, means for generating second oscillations of a stabilized prechosen frequency, a mixer circuit for combining said second oscillations with said first oscillations to produce third oscillations, means for generating stabilized predetermined frequency oscillations, said predetermined frequency oscillations having substantially the same frequency as said third oscillations, and frequency control means responsive to deviations of said third oscillations relative to said predetermined frequency oscillations for reducing such deviation by controlling the frequency of said first oscillations.

SHELDON I. RAMBO.

References Cited in the file of this patent

UNITED STATES PATENTS

| Number | Name | Date |
|---|---|---|
| 1,450,966 | Affel | Apr. 10, 1923 |
| 2,406,125 | Ziegler et al. | Aug. 20, 1946 |